(12) United States Patent
Damen et al.

(10) Patent No.: US 9,112,300 B2
(45) Date of Patent: Aug. 18, 2015

(54) ELECTRICAL CONNECTOR FOR LITHOGRAPHIC PROJECTION APPARATUS

(75) Inventors: Johannes Wilhelmus Damen, Budel (NL); Jeroen Van Duivenbode, Veldhoven (NL); Henricus Hubertus Adrianus Van Hout, Knegsel (NL)

(73) Assignee: ASML Netherlands B.V., Veldhoven (NL)

( * ) Notice: Subject to any disclaimer, the term of this patent is extended or adjusted under 35 U.S.C. 154(b) by 501 days.

(21) Appl. No.: 13/259,035

(22) PCT Filed: Jan. 28, 2010

(86) PCT No.: PCT/EP2010/051017
§ 371 (c)(1),
(2), (4) Date: Dec. 14, 2011

(87) PCT Pub. No.: WO2010/121844
PCT Pub. Date: Oct. 28, 2010

(65) Prior Publication Data
US 2012/0154776 A1    Jun. 21, 2012

Related U.S. Application Data

(60) Provisional application No. 61/170,851, filed on Apr. 20, 2009.

(51) Int. Cl.
*G03B 27/42* (2006.01)
*H01R 13/53* (2006.01)

(52) U.S. Cl.
CPC .................................... *H01R 13/53* (2013.01)

(58) Field of Classification Search
CPC ....................................................... G03F 7/70
USPC ............................. 355/133, 53; 439/271, 658
See application file for complete search history.

(56) References Cited

U.S. PATENT DOCUMENTS

| 3,871,735 | A |   | 3/1975  | Herrmann, Jr. |         |
|-----------|---|---|---------|---------------|---------|
| 4,600,480 | A |   | 7/1986  | Coombes et al.|         |
| 5,259,778 | A |   | 11/1993 | Zhang         |         |
| 5,618,190 | A | * | 4/1997  | Masuda et al. | 439/98  |

(Continued)

FOREIGN PATENT DOCUMENTS

| EP | 1 500 980 A1 | 1/2005 |
| EP | 1 056 162 B1 | 2/2007 |

(Continued)

OTHER PUBLICATIONS

International Search Report directed to related International Patent Application No. PCT/EP2010/051017, mailed Oct. 1, 2010, from the European Patent Office; 4 pages.

(Continued)

*Primary Examiner* — Deoram Persaud
(74) *Attorney, Agent, or Firm* — Sterne, Kessler, Goldstein & Fox P.L.L.C.

(57) ABSTRACT

An electrical connector suitable, for example, for connecting high voltage carrying cables in a low pressure environment comprises a housing having a conducting surface and a plurality of cable insertion parts, each cable insertion part comprising an electrical conductor configured to connect to an electrical cable and an insulating sleeve surrounding the electrical conductor, wherein the housing surrounds the plurality of cable insertion parts.

16 Claims, 3 Drawing Sheets

(56) References Cited

U.S. PATENT DOCUMENTS

| | | | |
|---|---|---|---|
| 5,645,450 A * | 7/1997 | Yamada et al. | 439/585 |
| 5,800,195 A | 9/1998 | Endo et al. | |
| 5,823,824 A * | 10/1998 | Mitamura et al. | 439/585 |
| 6,485,331 B1 * | 11/2002 | Lample | 439/578 |
| 6,749,464 B2 * | 6/2004 | Obata | 439/607.41 |
| 7,344,395 B2 | 3/2008 | Agethen et al. | |
| 7,413,478 B2 | 8/2008 | Kleinschmidt et al. | |
| 2004/0012767 A1 * | 1/2004 | Van Elp et al. | 355/72 |
| 2004/0189967 A1 * | 9/2004 | Ottens et al. | 355/67 |
| 2006/0268247 A1 * | 11/2006 | Butler | 355/53 |
| 2008/0310113 A1 | 12/2008 | Renders et al. | |

FOREIGN PATENT DOCUMENTS

| | | |
|---|---|---|
| GB | 191211306 A | 6/1913 |
| JP | 05-101855 A | 4/1993 |
| JP | 07-192803 A | 7/1995 |
| JP | 08-321349 A | 12/1996 |
| JP | 2000-166074 A | 6/2000 |
| JP | 2001-068230 A | 3/2001 |
| JP | 2004-158689 A | 6/2004 |
| JP | 2004-349290 A | 12/2004 |
| JP | 2005-353540 A | 12/2005 |
| JP | 2007-123899 A | 5/2007 |
| JP | 2007-234600 A | 9/2007 |
| JP | 2008-226887 A | 9/2008 |

OTHER PUBLICATIONS

International Preliminary Report on Patentability with the Written Opinion of the International Searching Authority directed to related International Patent Application No. PCT/EP2010/051017, issued Oct. 25, 2011, from the International Bureau of WIPO; 7 pages.

* cited by examiner

ELECTRICAL CONNECTOR FOR LITHOGRAPHIC PROJECTION APPARATUS

BACKGROUND OF THE INVENTION

1. Field of the Invention

The present invention relates to an electrical connector, an electrical connection system, a lithographic apparatus and a method for manufacturing a device.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

Some moving parts of the lithography apparatus are powered by a high voltage power supply. Furthermore, for some lithographic processes, parts of the lithography apparatus are kept at very low pressure. In particular, at very low pressure, a high voltage power supply may be used to power any actuators that are used to position the table on which the substrate is placed, any so-called blades that block a portion of the projection beam or any clamps that hold the mask or the substrate to a table that may be part of the lithography apparatus. Due to the fact that high voltage is used, and in particular because the components are situated in a very low-pressure environment, there is a problem that electrical breakdown may occur. The possibility of electrical breakdown limits the voltage of the power lines and presents a safety hazard. If a breakdown occurs, it can pollute surfaces of optical components, create electromagnetic interference that disturbs sensitive electronics and present a human safety hazard.

EP 1 056 162 B1 discloses a device for controlling an electric field. The device makes use of capacitive field control and geometrical field control. The capacitive field control comprises a plurality of capacitive layers arranged substantially concentrically between an inner live conductor and an outer ground potential. The geometrical field control comprises a stress cone, which is arranged in electrical contact ground potential. However, arcing may still occur from the cables to a nearby conductor. Arcing of this kind is a particular problem when electrical cables are connected in a system at low pressures. In Extreme Ultraviolet (EUV) lithography, the lithography process is performed at very low pressure in order to decrease the absorption of the EUV radiation by air.

In order to overcome this problem U.S. Pat. No. 6,485,331 B1 discloses a connection system for electrical cables, which operate under vacuum and carry high voltage electric pulses or currents. This connection system comprises a grounded outer metal shell connected to the metal sheathes of the cables and a dielectric insulating sleeve. The insulating sheath and sleeve enclose the cables to be connected. The system is fitted with seals to form a sealed cavity between insulating sleeves of the cables and the insulating sheath. This ensures that the insulators of the connection system remain immersed in a gas atmosphere even when part of the connection system is in a vacuum. This is designed to reduce arcing along the surfaces of insulator junctions of the connection systems. However, it is difficult to prevent leaks in such a system. Any leaks in the system increase the possibility of arcing.

U.S. Pat. No. 3,871,735 discloses a shielded high voltage connector for use with high voltage RG cable wherein the connector members can be shaped together.

BRIEF SUMMARY OF THE INVENTION

It is desirable, for example, to provide an electrical connector suitable for connecting high voltage electric cables at low pressure and in which arcing is reduced or eliminated.

According to an aspect of the present invention, there is provided an electrical connector comprising a housing having a conducting surface and a plurality of cable insertion parts. Each cable insertion part comprises an electrical conductor configured to connect to an electrical cable and an insulating sleeve surrounding the electrical conductor. The housing surrounds the plurality of cable insertion parts.

According to a further aspect of the present invention, there is provided an electrical connection system comprising a male electrical connector and a female electrical connector. The male and female electric connectors each comprise a housing having a conducting surface and a plurality of cable insertion parts. Each cable insertion part comprises an electrical conductor configured to connect to an electrical cable and an insulating sleeve surrounding the electrical conductor. The housing surrounds the plurality of cable insertion parts. The male electrical connector and the female electrical connector interconnect.

According to a further aspect of the present invention, there is provided an electrical connection system comprising an insulating sleeve and a plurality of conducting bands that surround the insulating sleeve. There is gap between each conducting band such that the insulating sleeve is exposed at each gap.

In addition, the present invention is directed to lithography systems and sub-system including the connector or connection system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
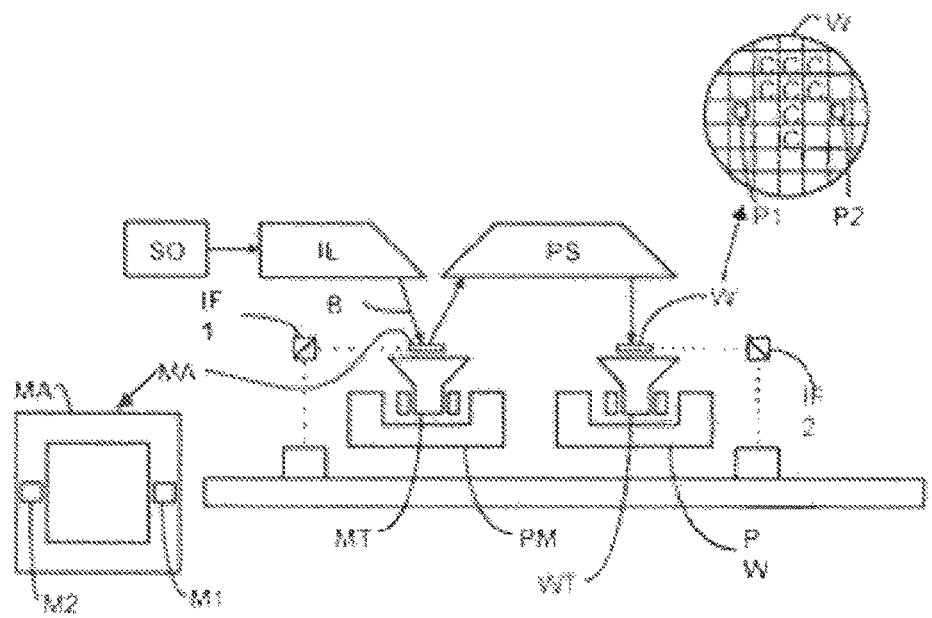
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g., UV radiation or EUV radiation).

a support structure (e.g., a mask table) MT constructed to support a patterning device (e.g., a mask) MA and connected to a first positioner PM configured to accurately position the patterning device in accordance with certain parameters;

a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device,"

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g., employing a reflective mask). Alternatively, the apparatus may be of a transmissive type (e.g., employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

A masking device, which defines the area on the patterning means that is illuminated, may be included in the illuminator IL. The masking device may comprise a plurality of blades, for example four, whose positions are controllable, e.g., by actuators such as stepper motors, so that the cross-section of the beam may be defined. It should be noted that the masking device need not be positioned proximate the patterning means but in general will be located in a plane that is imaged onto the patterning means (a conjugate plane of the patterning means). The open area of the masking means defines the area on the patterning means that is illuminated but may not be exactly the same as that area, e.g., if the intervening optics have a magnification different than 1.

Figure 5:
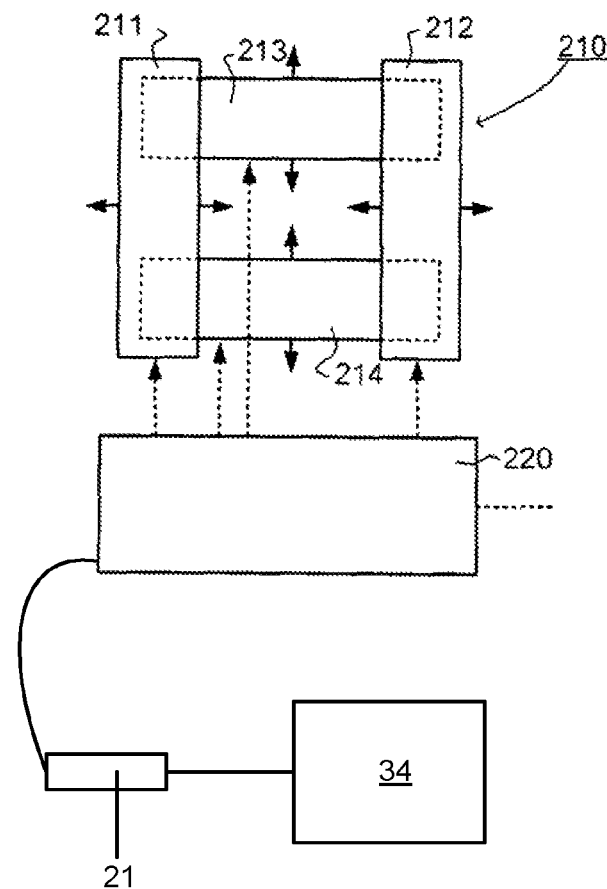
FIG. 5 depicts a beam interceptor connected to a power supply by a connection system according to an embodiment of the invention.

According to an embodiment of the invention, the masking device comprises a beam interceptor 210, comprising opaque blades 211, 212, 213, 214 that are arranged to intercept part of the radiation beam B, as is shown in FIG. 5. The blades 211, 212, 213, 214 manipulate the size and shape of the exposed projection beam B on the mask MA and accordingly on the target portions C. The movement and positioning of the blades 211, 212, 213, 214 is controlled by a control system 220. If a projected target portion C is not fully positioned on the substrate W, the control system 220 is arranged to define a new size for this particular target portion C and actuate the beam interceptor 210 accordingly.

The patterning device (e.g., mask MA) is held on the support structure (e.g., mask table MT) and is patterned by the patterning device. The mask MA can be clamped to the mask table MT on both surfaces of the mask. By clamping the mask MA on both surfaces, the mask can be subjected to large accelerations without slipping or deformation. The clamping, or holding force may be applied using thin membranes, which further prevent deformation of the mask. By the clamp, a normal force between adjacent surfaces of the mask and the mask table MT is generated, resulting in a friction between contacting surfaces of the mask and the mask table. The clamping force to the surfaces of the mask MA may be generated using electrostatic or mechanical clamping techniques.

Figure 6:
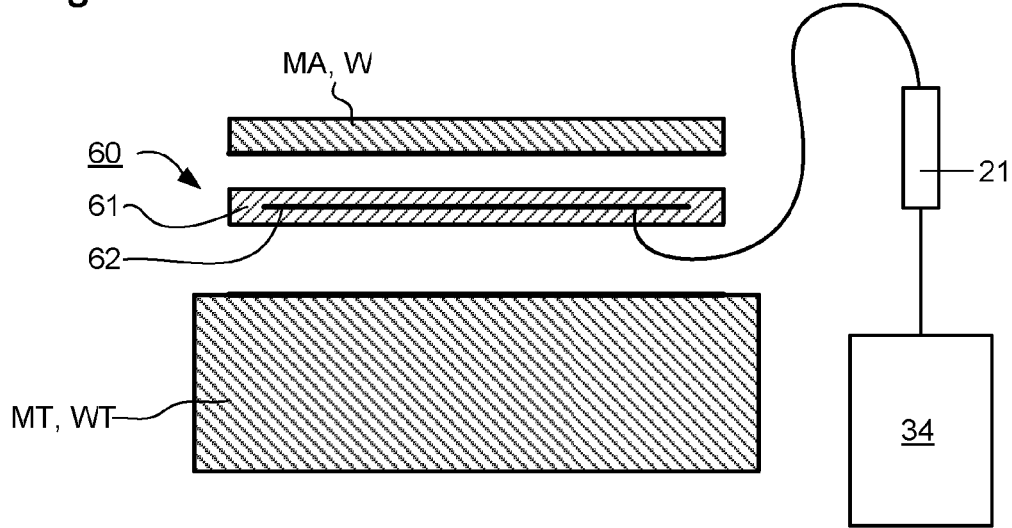
FIG. 6 depicts an electrostatic clamp connected to a power supply by a connection system according to an embodiment of the invention.

In EUV lithographic processes, electrostatic clamps may be used to clamp the mask MA to the mask table MT and/or the substrate W to the substrate table WT. FIG. 6 depicts an exemplary electrostatic clamp that is connected to a power supply 34 via an electrical connection system 21 according to an embodiment of the present invention. In the exemplary electrostatic clamp depicted in FIG. 6, a chuck 60 comprises a dielectric or slightly conductive body 61 with an embedded electrode 62. The power supply 34 is used to apply a potential difference between the mask MA or the substrate W and the chuck 60 and between the chuck 60 and the table MT, WT so that electrostatic forces clamp the mask MA or substrate W and the chuck 60 to the table MT, WT. The embedded electrode 62 is connected to the power supply 34.

The radiation beam B is incident on the patterning device (e.g., mask MA). Having traversed the mask MA, the radiation beam B passes through the projection system PS, which focuses the beam onto a target portion C of the substrate W. With the aid of the second positioner PW and position sensor IF2 (e.g., an interferometric device, linear encoder or capacitive sensor), the substrate table WT can be moved accurately, e.g., so as to position different target portions C in the path of the radiation beam B. Similarly, the first positioner PM and another position sensor IF1 can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The first positioner PM, the second positioner PW, the motors that control any blades that may be comprised in the masking device and any clamps that may be comprised in the lithographic projection apparatus are powered by a high voltage power supply. High voltage is taken to mean that the power supply produces an output of the order of hundreds or thousands of volts. In an embodiment, the output of the power supply is greater than 100V, greater than 200V, greater than 500V, greater than 1000V, greater than 2000V, greater than 5000V.

Figure 2A:
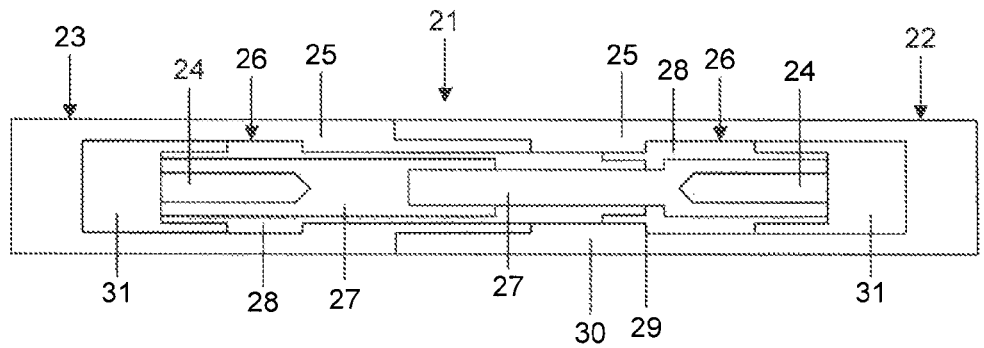
FIG. 2A depicts a connected male/female pair of electrical connectors according to one embodiment of the invention and FIG. 2B depicts an unconnected male/female pair of electrical connectors according to the same embodiment.
Figure 2B:
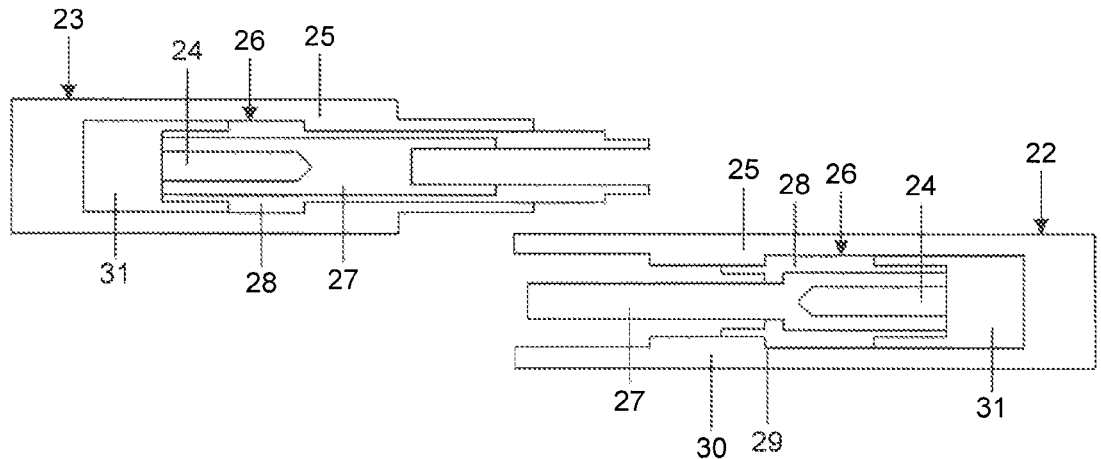

FIGS. 2A and 2B schematically depict an electrical connection system 21 according to one embodiment of the present invention. The electrical connection system is a plug and socket connector that comprises a male electrical connector 22 and a female electrical connector 23. The male and female connectors have complementary constructions such that they securely interconnect with each other. This forms an electrical connection between one or more pairs of electrical cables 24. For each pair of electrical cables 24 that are to be connected, one cable is electrically connected to the male connector 22 and one cable is electrically connected to the female connector 23.

Although as mentioned above, the male and female connectors have different physical constructions in some respects, both types of connector are embodiments of the present invention.

The (male or female) electrical connector according to an embodiment of the present invention comprises a housing 25.

The housing 25 may be made of an electrically conducting material. Optionally the housing material is a light alloy. Alternatively, the housing 25 may be made of an electrically insulating material, but have an electrically conducting surface. For example, the housing 25 may be made of a plastic and be plated with an electrically conducting material. The housing 25 may be die cast. Desirably the housing 25 is corrosion resistant.

In the exemplary embodiment depicted in FIGS. 2A and 2B, the end part of the housing 25 of the female connector 23 is constructed so as to fit inside the corresponding end part of the housing 25 of the male connector 22. This helps to keeps the respective parts in the correct relative positions, helping to form a stable electrical connection between a pair of electrical cables 24.

The purpose of the housing 25 is to control the electric field produced by an electrical cable 24 connected to the electrical connector. For many lithographic applications, the voltage of the electrical cables is very high, e.g., hundreds or thousands of volts. Unless the electric field is controlled, suppressed or blocked, there is a danger that arcing occurs from the high voltage electrical cable 24 to another component of the lithographic apparatus.

The housing 25 controls the electric field by capturing free electrons from the electrical cable 24 before they acquire dangerous levels of kinetic energy, and/or by preventing electrons from accelerating in dangerous directions through the gas in the environment of the connector. As such, it is desirable for the electrically conductive housing 25 to be electrically connected to ground potential. Therefore, optionally, the housing 25 has a connecting region on its outer surface configured to connect to ground potential.

Hence, the housing 25 according to an embodiment of the present invention performs a different function to the housing of conventional electrical connectors. For example, some conventional electrical connectors have a housing that is made of an insulating material, such as an insulating plastic. This provides mechanical protection for the connector. Although such a connector may be suitable for use at low voltages, it may fail in applications requiring high voltage cables to be connected due to arcing from the cable to other electrically conductive components.

In a standard electrical connector for connecting coaxial cables, the outer housing of the connector is required to form a grounded screen that totally surrounds the inner conductor of the coaxial cables where the outer conductor of the cable does not surround the inner conductor at the connection point. The purpose of this is to confine the electric field to the space between the inner conductor and the housing. The only break in the housing may be venting holes that are small enough not to significantly disturb the electric field.

The electrical connector according to an embodiment of the present invention works by a different principle, which does not require the housing to form an uninterrupted grounded screen around the electrical cables. It is sufficient that the housing 25 surrounds the cable insertion parts 26 of the connector within which the voltage carrying cable and conductor lies.

As mentioned above, the male and female connectors are complimentarily shaped, thereby allowing them to securely interlock. As an extra measure to ensure the security of the connection, a locking system may be provided on the housings of the connectors. Such a locking system may take the form of two levers on either side of the housing of one of the male and female connectors. Two pairs of protruding pins are positioned on the corresponding ends of the housing of the other connector. When the connectors are connected together, the levers hook onto the pins, thereby forming a secure connection. Alternatively, there may be only one lever and one pair of pins. Such levers may be made, for example, from stainless steel. Alternatively or additionally, the locking system may comprise a screw and bolt system.

The connector comprises at least two cable insertion parts 26. Each cable insertion part 26 comprises an electrical conductor 27 surrounded by an electrically insulating sleeve 28. The conductor 27 is configured to connect to an end of an electrical cable 24.

Some lithographic manufacturing methods are required to be performed at very low pressure, such as 10 Pa. For example, lithographic methods that use EUV radiation must be performed in a deep vacuum. This is because air absorbs the EUV radiation. Each component of the lithographic apparatus must therefore be suitable for use at low pressure. This includes the electrical connectors that connect one or more components of the lithographic apparatus to high voltage power supplies. Additionally, it is also desirable to be able to use the same electrical connectors at atmospheric pressure Suitable insulating material for the electrical connector includes a liquid crystal polymer, polyetheretherketone (PEEK) or polytetrafluoroethylene (PTFE). Other insulators may also be suitable.

The insulating sleeve 28 of a cable insertion part 26 takes substantially the form of a tube. The insulating sleeve 28 is arranged to substantially surround the end of the electrical cable 24 that is to be connected. The end of the cable 24 is stripped of its own insulating sleeve and inserted into the cable insertion part 26, whereupon the insulating sleeve 28 of the electrical connector surrounds it. Optionally, the inner surface of the insulating sleeve 28 takes the form of a cylinder.

The precise construction of the insulating sleeve 28 desirably differs for the male connector 22 and female connector 23. In the exemplary embodiment depicted in FIG. 2, the insulating sleeve 28 of the female connector 23 extends beyond the housing 25, while the insulating sleeve 28 of the male connector 22 stops within the housing 25. In one embodiment, the end of the insulating sleeve 28 of the female connector 23 that is nearest the male connector 22 fits inside the end of the insulating sleeve 28 of the male connector 22 that is nearest the female connector 23. This helps to form a stable electrical connection by ensuring that the relative positions of the male and female connectors are stable.

As shown in FIG. 2, there is optionally a ridge 29 on the inside surface of the housing 25, with a corresponding flange 30 on the outer surface of the insulating sleeve 28. The flange 30 contacts the ridge 29. This helps to prevent the insulating sleeve 28 from sliding within the housing 25.

Optionally, the end of each insulating sleeve 28 that is nearest the electrical cable 24 fits complimentarily inside a cover cap 31. The cover cap 31 surrounds the end of the insulating sleeve 28 and contacts the inner surface of the housing 25. The cover cap 31 is made of an insulating material, such as a liquid crystal polymer, polyetheretherketone (PEEK) or polytetrafluoroethylene (PTFE).

The electrical conductor 27 of each cable insertion part 26 defines whether the electrical connector is male or female. The conductor 27 of the male connector 22 fits inside and electrically contacts the conductor 27 of the female connector 23. Optionally, the conductor 27 of the male/female connector does not protrude beyond the housing 25 of the connector.

For both male and female connectors, the conductor 27 is configured to contact an electrical cable 24 that is to be connected. The electrical cable 24 inserts into the back end of the conductor 27, i.e., the end of the conductor 27 that is furthest from the corresponding connector of the opposite gender.

The point of connection between the electrical cable 24 and the conductor 27 of the cable insertion part 26 is called a terminal. The connection may be effected by a screw terminal, in which a screw that is electrically connected to the conductor 27 is used to hold an end of the electrical cable in electrical contact with the conductor 27. Alternatively, the terminal may be a crimp connection. In this case, a stripped end of the electrical cable 24 is inserted into the cable insertion part 26. A portion of the terminal is then compressed tightly around the cable by squeezing it with a special crimping tool. As a further alternative, a cage-clamp terminal may be used.

It is well known that under most circumstances the potential difference required for electrical discharge between two electrical conductors increases with increasing pressure. For this reason, in the prior art, electrical connectors that are intended for use at low pressures have been constructed to be gas tight. In this case, the inside of the electrical connector can be maintained at a higher pressure than the surrounding pressure. This prevents the breakdown voltage from decreasing with the decreased pressure, thereby reducing the possibility of arcing.

However, it is very difficult to produce an electrical connection system for connecting a pair of wires that is completely gas tight. Any leaks in a connection system of which the interior is maintained at a higher pressure than the surrounding pressure will reduce the pressure inside the connection system, thereby reducing the breakdown voltage and increasing the possibility of arcing.

Alternatively, there may be a connection system of which the interior is maintained at a lower pressure than the surrounding pressure in order to increase the electrical breakdown voltage inside the connection system. Any leaks in such a connection system will increase the pressure inside the connection system, thereby reducing the breakdown voltage and increasing the possibility of arcing.

For example, in plug and socket electrical connectors, there may be a gas leak at the points of overlap of the housing of the male and female connectors. Gas leaks are also difficult to prevent at the point where an electrical cable enters the back of the connector. The cable may not be gas tight with the housing of the connector. This allows gas to pass through a space between the outside surface of the electrical cable and the housing of the connector.

The electrical connector and electrical connection system according to an embodiment of the present invention do not need to be gas tight. This is because, as mentioned above, the electrically conductive housing controls the electric field.

In electrical connectors that are used to connect multiple pairs of cables, in addition to the danger of arcing between one of the electrical cables and another electrical component of the lithographic apparatus, there is the further danger of arcing between one electrical cable and an adjacent electrical cable within the connection system. Conventionally, such cables would have to be kept separated by a sufficient distance or be separately connected by individual connection systems, for example.

In an electrical connector and electrical connection system according to the present invention, an upper limit for gap distances between conductors at different voltages is set. The upper limit depends on the pressure at which the connector or connection system is to be used.

For a working pressure of 10 Pa for an electrical connection system configured to connect electrical cables carrying a voltage of 300V, the maximum gap distance between electrical conductors may suitably be set to 80 mm. In other words, in order to reduce the possibility of arcing between electrical cables within the connection system, the distance between any electrical cables within the connection system must be no more than 80 mm.

The electrical cables 24 lie within the insulating sleeves 28 of the cable insertion parts 26. Therefore, in order to effect the above maximum gap distance, the distance between the inside surfaces of any two insulating sleeves 28 of the electrical connector is set as d≤80 mm at a pressure of 10 Pa.

Optionally, as an additional safety precaution, the gap distances within the electrical connection system are set to be 5 times smaller than the above maximum gap distance. This 5× factor gives d≤15 mm.

This safety factor may be particularly important because the geometrical shape of the electrical contacts affects the breakdown voltage. In the electrical connector according to an embodiment of the present invention, the conductors 27 within the insulating sleeves 28 have a pointed shape. This reduces the breakdown voltage with respect to parallel plates, for example.

Although it may be attempted to maintain the surrounding pressure at 10 Pa for a lithographic process, there may be unintended leakage of the vacuum vessel that will lead to a pressure increase. At such low pressure, an increase in pressure may lead to a potentially dangerous decrease of breakdown voltage.

Optionally, the electrical connector is designed such that d≤40 mm. This is a suitable upper limit on d if the connector is to be used at a pressure of 20 Pa. Optionally, with the 5× safety factor in force, d≤8 mm.

Optionally, the lithographic apparatus comprises a display means for displaying a signal that the situation is safe when the pressure is 10 Pa or lower. A pressure sensor detects the pressure within the vacuum vessel. When the pressure sensor detects that the pressure has increased above 10 Pa, the signal will stop being displayed. Optionally, the lithographic apparatus has a safety device that prevents the pressure inside the vacuum vessel from increasing above 20 Pa when there is an unintended leak.

Optionally, the lithographic apparatus comprises a safety cut out system that switches off the power supply when the pressure increases above a particular pressure. For example, a pressure sensor detects the pressure. When it is detected that the pressure is greater than 20 Pa, for example, a signal is sent to the power supply to switch off.

In general, the set maximum gap distance is inversely proportional to the pressure according to the following equation:

$$d \leq \frac{0.8}{p},$$

where the pressure, p, is in Pascals and the gap distance, d, is in meters. Optionally the maximum gap distance is set as less than 150 mm, less than 80 mm, less than 40 mm, less than 30 mm, less than 15 mm, less than 8 mm When the voltage carried by the electrical cables 24 that are connected by the connection system is known, an additional constraint may be placed on the maximum gap distance. Alternatively if it is desired that the connector be safe for use with electrical cables carrying voltages up to a certain limit, an additional constraint may be placed on the maximum gap distance.

If it is desired that the connector be used for voltages up to 5 kV, at a pressure of 10 Pa, the maximum gap distance is set as d≤30 mm, or with the 5× safety factor, as d≤6 mm. For voltages up to 2 kV, the maximum gap distance is set as d≤30 mm, or with the 5× safety factor, as d≤6 mm. Optionally, the maximum gap distance is set to be less than 40 mm, less than 35 mm, less than 30 mm, less than 25 mm, less than 20 mm, less than 15 mm, less than 10 mm, less than 8 mm, less than 7 mm.

In general, the maximum gap distance may be set such that $$V \geq \frac{450\,pd}{\ln(pd) + 1.5},$$

where V is the potential difference between electrical conductors. This formula may be useful for predicting the theoretical electrical breakdown voltage between conductors. However, the actual electrical breakdown voltage may be different to the value determined from this formula. In particular, the breakdown voltage may vary depending on the geometry of the electrodes. The actual electrical breakdown voltage in a given situation may be determined experimentally.

With the maximum distance between cables within the electrical connector set such that arcing is not possible or at least greatly reduced, it is not necessary to surround each cable insertion part 26 by an individual housing. It is only necessary that the housing 25 surround the cable insertion parts 26 when taken together, in order to control the electric field.

Desirably, any region between the cable insertion parts 26 is occupied by only electrically insulating material. In other words, the housing 25 does not come between the cable insertion parts 26 to isolate each one individually.

In addition to the possibility of arcing between electrical cables 24, there may be arcing from the electrical cable to the housing 25 of the connector. Therefore, one of the above maximum values of d is optionally applied to the distance between the inner surface of any of the insulating sleeves 28 and the housing 25.

Figure 3:
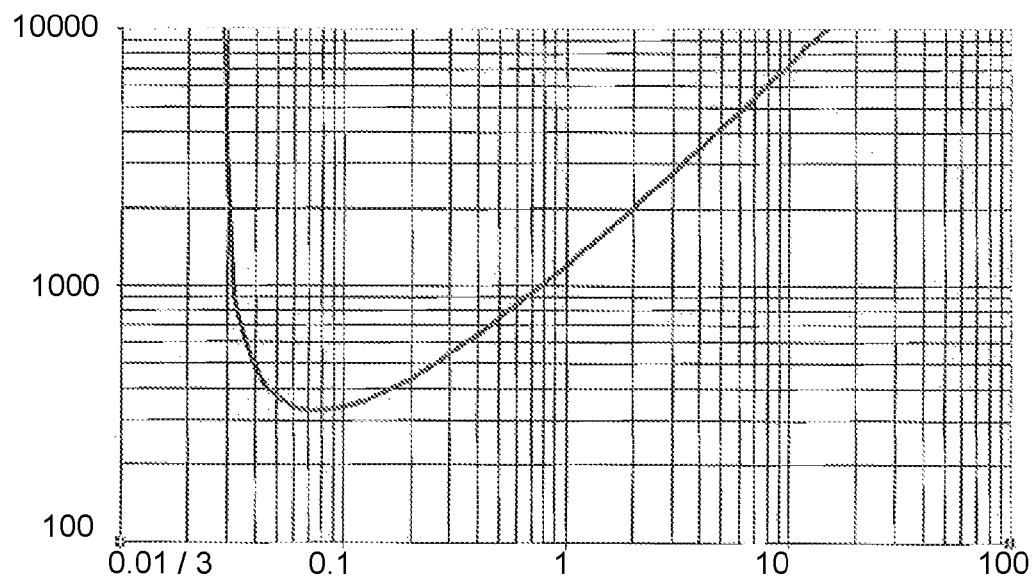
FIG. 3 depicts the theoretical Paschen curve for parallel plates in air.

Setting an upper limit for gap distances at extremely low pressure prevents electrical breakdown because the relationship between breakdown voltage and gap distance is different at low pressure compared to atmospheric pressure. Specifically, at atmospheric pressure, as the yap distance is reduced, the breakdown voltage is reduced accordingly. When the pressure is sufficiently low however, the breakdown voltage dramatically increases as the gap distance is decreased below a threshold distance. The graphical form of the relationship between gap distance and breakdown voltage at a pressure of 10 Pa is depicted in FIG. 3.

Under pressure conditions that are sufficiently low, electrical breakdown is more likely to occur along a longer gap between electrical conductors than a short path. This means that provided that the distance between electrical conductors within an electrical connector is sufficiently small and the pressure is sufficiently low, the breakdown voltage will be too high for electrical breakdown to occur.

In fact, the theoretical breakdown voltage is related to the product of gap distance and pressure by the formula $$V = \frac{Apd}{\ln(pd) + B}.$$

The values of the constants A and B depend on the composition of the gas, in which the conductors are situated, and the material and geometry of the conductors. For parallel plates in air, $A \approx 450\,\mathrm{VPa^{-1}\,m^{-1}}$ and $B \approx 1.5$, where V is measured in Volts, p is measured in Pascals and d is measured in meters. As mentioned above, although this formula may be used to predict the theoretical electrical breakdown voltage between conductors, the actual electrical breakdown voltage in a given situation may be differ from the value determined by this formula.

The minimum value of V occurs at $$d = \frac{e^{1-B}}{p}.$$

To the right of this turning point in the curve (the "elbow"), breakdown voltage is seen to behave in a well-known manner, increasing together with both increasing gap distance and pressure. To the left of the elbow, the breakdown voltage dramatically increases as either the gap distance or pressure is lowered. Therefore, electrical discharge can be reduced or avoided by ensuring that the product pd is left of the elbow.

Setting a maximum value for gap distances at low pressure within the electrical connector enables prevention of arcing over a short gap distance. The electric field control performed by the housing 25 prevents arcing along longer gap distances. Hence, the combination of the maximum gap distance and the electric field control prevents arcing over any gap distance.

Although in the above description, embodiments of the present invention have been mainly described for use at a maximum pressure of 10 Pa, the maximum pressure may be set at a different value, for example 5 Pa, 15 Pa or 20 Pa. Depending on the value of the maximum working pressure of the electrical connector and the maximum voltage, the dimensional requirements of the connector will change correspondingly according to the equations $$d \leq \frac{0.8}{p} \text{ and } V \geq \frac{450\,pd}{\ln(pd) + 1.5}.$$

An additional safety factor may be applied to the upper limit of the gap distance, for example 5×.

In one embodiment, the number of cable insertion parts 26 in the electrical connector is three. However, the number may be two, four, five, six, nine etc.

Figure 4:
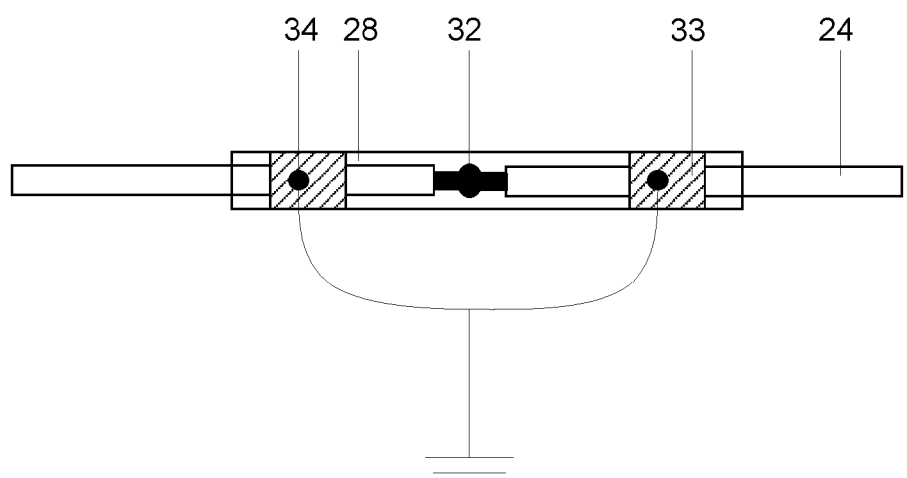
FIG. 4 depicts an electrical connection system according to an embodiment of the invention.

FIG. 4 depicts an embodiment of the present invention. This is an electrical connection system for connecting a single pair of electrical cables 24. In this embodiment, the connection system comprises an insulating sleeve 28. The insulating sleeve 28 is configured to surround the connection 32 between the two electrical cables 24 that are to be connected. In particular, the insulating sleeve surrounds the portion of the electrical cables that have been stripped of their own insulation. The insulating sleeve 28 is made of an insulating material, such as a liquid crystal polymer, polyetheretherketone (PEEK) or polytetrafluoroethylene (PTFE).

Two electrically conducting bands 33 surround the insulating sleeve. The bands 33 are on opposite sides of the point 32 at which the two electrical cables are connected. Although FIG. 4 depicts two conducting bands, there may be a greater number of conducting bands 33, e.g., three, or four bands, for example.

The purpose of the conducting bands 33 is to control the electric field produced by the electrical cables 24 that are to be connected. This prevents arcing from the electrical cables 24 to electrical components that are external to the connection. This arcing prevention method is effective even though a part or parts of the insulating sleeve 28 that surrounds the connection 32 is exposed (i.e., not shielded by a conductor).

In use, the conducting bands 33 are connected to ground potential. Therefore, the conducting bands 33 desirably comprise a connecting region 34 configured to connect to ground potential.

This electrical connection system may be formed as an interconnecting combination of a male and female electrical connector, each having at least one conducting band 33 surrounding the insulating sleeve 28. In this case, when the male and female connectors are joined together, the insulating sleeves interconnect, but the conducting bands 33 do not come into physical contact with each other.

Additionally, the optional features of the different forms of conductor terminal and insulating cover caps are equally applicable to this connection system as to the embodiments of the present invention described above.

The above described embodiments of electrical connectors and electrical connection systems 21 of the present invention are suitable for use in a lithographic apparatus to connect an actuator of a mask table or a substrate table to a power supply 34. Additionally, embodiments of the present invention may be used to connect any beam interceptor 210 (such as a blade) or any clamp (e.g., an electrostatic clamp) used to fix a mask or a substrate to a table that may form part of a lithographic apparatus. However, the electrical connector and electrical connection system according to embodiments of the present invention is not limited to use as part of a lithographic apparatus. The electrical connector and electrical connection system is applicable in other situations where it is desired to connect electrical cable that carry high voltages in low pressure environments.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An electrical connection system for connecting a first electrical cable and a second electrical cable comprising:
   a male electrical connector configured to connect to an end of the first electrical cable comprising:
      a first housing having a first conducting band; and
      first cable insertion parts surrounded by the first conducting band, the first cable insertion parts comprising:
         a first electrical conductor configured to connect to the end of the first electrical cable; and
         a first insulating sleeve surrounding the first electrical conductor; and
   a female electrical connector configured to connect to an end of the second electrical cable comprising:
      a second housing having a second conducting band; and
      second cable insertion parts surrounded by the second housing, the second cable insertion parts comprising:
         a second electrical conductor configured to connect to the end of the second electrical cable; and
         a second insulating sleeve surrounding the second electrical conductor,
   wherein the male electrical connector and the female electrical connector interconnect to form an electrical connection between the first electrical conductor and the second electrical conductor and the first conducting band and the second conducting band are not in physical contact while the male electrical connector and the female electrical connector are electrically interconnected.

2. The electrical connector according to claim 1, wherein a maximum distance d, between an inner surface and an outer surface of either the first or second insulating sleeve, is less than about 80 mm.

3. The electrical connector according to claim 2, wherein a maximum distance d, between an inner surface and an outer surface of either the first or second insulating sleeve, is less than about 30 mm.

4. The electrical connector according to claim 1, wherein a maximum distance d, between the inner surface of each of the first or second insulating sleeves and the first or second housings, respectively, is less than about 80 mm.

5. The electrical connector according to claim 4, wherein a maximum distance d, between the inner surface of each of the first or second insulating sleeves and the first or second housings, respectively, is less than about 30 mm.

6. The electrical connector according to claim 1, wherein each region between the first and second insulating sleeves is occupied by electrically insulating material.

7. The electrical connector according to claim 1, wherein each of the first or second cable insertion parts comprises an insulating cover cap configured to surround an end of the respective first or second insulating sleeve.

8. A lithographic apparatus comprising:
an illumination system configured to generate a radiation beam;
a support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate;
a beam interceptor that is arranged to intercept a portion of a part of the projection beam;
a controller configured to actuate the beam interceptor; and
an electrical connection system for connecting a first electrical cable and a second electrical cable and configured to couple a controller to a power supply the electrical connection system comprising:
a male electrical connector configured to connect to an end of the first electrical cable comprising:
a first housing having a first conducting band; and
first cable insertion parts surrounded by the first conducting band, the first cable insertion parts comprising:
a first electrical conductor configured to connect to the end of the first electrical cable; and
a first insulating sleeve surrounding the first electrical conductor; and
a female electrical connector configured to connect to an end of the second electrical cable comprising:
a second housing having a second conducting band; and
second cable insertion parts surrounded by the second housing, the second cable insertion parts comprising:
a second electrical conductor configured to connect to the end of the second electrical cable; and
a second insulating sleeve surrounding the second electrical conductor,
wherein the male electrical connector and the female electrical connector interconnect to form an electrical connection between the first electrical conductor and the second electrical conductor and the first conducting band and the second conducting band are not in physical contact while the male electrical connector and the female electrical connector are electrically interconnected.

9. The lithographic apparatus according to according to claim 8, wherein a maximum distance d, between the first electrical conductor and the first housing and between the second electrical conductor and the second housing is given by the relation:

$$d \leq \frac{0.8 \; N \cdot m}{p}$$

wherein p is pressure in Pascals.

10. The lithographic apparatus according to according to claim 8, wherein the first or second housing comprises a plurality of conducting bands, the plurality of conducting bands being physically separated to leave the respective first or second insulating sleeve exposed while the male electrical connector and the female electrical connector are electrically interconnected.

11. A lithographic apparatus comprising:
a substrate table constructed to hold a substrate;
a clamp to hold the substrate on a surface of the substrate table; and
an electrical connection system or connecting a first electrical cable and a second electrical cable and configured to couple a controller to a power supply the electrical connection system comprising:
a male electrical connector configured to connect to an end of the first electrical cable comprising:
a first housing having a first conducting band; and
first cable insertion parts surrounded by the first conducting band, the first cable insertion parts comprising:
a first electrical conductor configured to connect to the end of the first electrical cable; and
a first insulating sleeve surrounding the first electrical conductor; and
a female electrical connector configured to connect to an end of the second electrical cable comprising:
a second housing having a second conducting band; and
second cable insertion parts surrounded by the second housing, the second cable insertion parts comprising:
a second electrical conductor configured to connect to the end of the second electrical cable; and
a second insulating sleeve surrounding the second electrical conductor,
wherein the male electrical connector and the female electrical connector interconnect to form an electrical connection between the first electrical conductor and the second electrical conductor and the first conducting band and the second conducting band are not in physical contact while the male electrical connector and the female electrical connector are electrically interconnected.

12. The lithographic apparatus according to claim 11, wherein the clamp is an electrostatic clamp.

13. The lithographic apparatus according to according to claim 11, wherein a maximum distance d, between the first electrical conductor and the first housing and between the second electrical conductor and the second housing is given by the relation:

$$d \leq \frac{0.8 \; N \cdot m}{p}$$

wherein p is pressure in Pascals.

14. The lithographic apparatus according to according to claim 11, wherein the first or second housing comprises a plurality of conducting bands, the plurality of conducting bands being physically separated to leave the respective first or second insulating sleeve exposed while the male electrical connector and the female electrical connector are electrically interconnected.

15. An electrical connection system comprising:
a male electrical connector comprising:
a first housing having a first conducting band; and
first cable insertion parts surrounded by the first conducting band, the first cable insertion parts comprising:

a first electrical conductor configured to connect to a first electrical cable; and
a first insulating sleeve, surrounding the first electrical conductor; and a female electrical connector comprising:
a second housing having a second conducting band; and
second cable insertion parts surrounded by the second housing, the second cable insertion parts comprising:
a second electrical conductor configured to connect to a second electrical cable; and
a second insulating sleeve surrounding the second electrical conductor, wherein the male electrical connector and the female electrical connector are configured to interconnect to form an electrical connection between the first electrical conductor and the second electrical conductor and the first conducting band and the second conducting band are not in physical contact while the male electrical connector and the female electrical connector are electrically interconnected; and wherein a maximum distance d, between the first electrical conductor and the first housing and between the second electrical conductor and the second housing is given by the relation:

$$d \leq \frac{0.8 \ N \cdot m}{p}$$

wherein p is pressure in Pascals.

16. An electrical connection system comprising:
a male electrical connector comprising:
a first housing having a first conducting band; and
first cable insertion parts surrounded by the first conducting band, the first cable insertion parts comprising:
a first electrical conductor configured to connect to a first electrical cable; and
a first insulating sleeve surrounding the first electrical conductor; and a female electrical connector comprising:
a second housing having a second conducting band; and
second cable insertion parts surrounded by the second housing, the second cable insertion parts comprising:
a second electrical conductor configured to connect to a second electrical cable; and
a second insulating sleeve surrounding the second electrical conductor, wherein the male electrical connector and the female electrical connector are configured to interconnect to form an electrical connection between the first electrical conductor and the second electrical conductor and the first conducting band and the second conducting band are not in physical contact while the male electrical connector and the female electrical connector are electrically interconnected; and wherein the first or second housing comprises a plurality of additional conducting bands, the plurality of additional conducting bands being physically separated to leave the respective first or second insulating sleeve exposed while the male electrical connector and the female electrical connector are electrically interconnected.

* * * * *